United States Patent [19]
Hause et al.

[11] Patent Number: 5,893,750
[45] Date of Patent: Apr. 13, 1999

[54] METHOD FOR FORMING A HIGHLY PLANARIZED INTERLEVEL DIELECTRIC STRUCTURE

[75] Inventors: Fred N. Hause, Austin; Mark I. Gardner, Cedar Creek, both of Tex.; Kuang-Yeh Chang, Los Gatos, Calif.

[73] Assignee: Advanced Micro Devices, Inc.

[21] Appl. No.: 08/888,822

[22] Filed: Jul. 7, 1997

Related U.S. Application Data

[63] Continuation of application No. 08/558,645, Nov. 13, 1995, abandoned.

[51] Int. Cl.$^6$ .................................................. H01L 21/443
[52] U.S. Cl. .......................... 438/633; 438/788; 438/695; 438/787
[58] Field of Search ...................... 438/626, 631, 438/633, 692, 788, 691, 695, 732, 787

[56] References Cited

U.S. PATENT DOCUMENTS

| | | | |
|---|---|---|---|
| 5,068,207 | 11/1991 | Manocha et al. | 437/231 |
| 5,124,014 | 6/1992 | Foo et al. | |
| 5,290,358 | 3/1994 | Rubloff et al. | 118/715 |
| 5,302,233 | 4/1994 | Kim et al. | 156/636 |
| 5,312,512 | 5/1994 | Allman et al. | 156/636 |
| 5,320,706 | 6/1994 | Blackwell | 156/636 |
| 5,399,389 | 3/1995 | Hieber et al. | 427/579 |
| 5,403,780 | 4/1995 | Jain et al. | 437/195 |
| 5,445,996 | 8/1995 | Kodera et al. | 437/225 |
| 5,472,825 | 12/1995 | Sayka | 430/311 |
| 5,494,854 | 2/1996 | Jain | 437/195 |
| 5,516,729 | 5/1996 | Dawson et al. | |
| 5,783,488 | 7/1998 | Bothra et al. | |

FOREIGN PATENT DOCUMENTS 2-177433  7/1990  Japan.

OTHER PUBLICATIONS

Wang, C.K., et al., "Characterization of Electron Cyclotron Resonance Plasma Oxide for Sub–half Micron Technology," 1995 International Symposium on VLSI Technology, Systems, and Applications: proceedings of technical papers, Taiwan, R.O.C., pp. 169–172.

S. Wolf, "Silicon Processing for the VLSI Era," vol. 2, pp. 237–238.

C.K. Wang, et al. "Characterization of ECR plasma oxide for Sub–half micron Technology" Int. Symp. on VLSI Tech. Proc 1995 (May 31, 1995) pp. 169–172. (Abstract Only).

*Primary Examiner*—Caridad Everhart
*Attorney, Agent, or Firm*—Kevin L. Daffer; Robert C. Kowert; Conley, Rose & Tayon

[57] ABSTRACT

A method is provided for forming a highly planarized interlevel dielectric layer over interconnects formed upon a frontside surface of an upper topography of a silicon wafer. An anisotropic silicon dioxide (oxide) layer is first deposited over the interconnects. Unlike conformal dielectric layers, anisotropic dielectric layers are able to fill narrow spaces between closely-spaced interconnects without creating voids in the process. The anisotropic oxide layer may be formed using a PECVD technique with the introduction of TEOS, $O_2$, and He or $NH_3$, or using an electron-cyclotron-resonance (ECR) plasma CVD method. A spin-on glass (SOG) layer is then formed over the anisotropic oxide layer. The liquid SOG material flows over the upper surface, filling narrow spaces without creating voids and producing a surface smoothing effect at isolated vertical edges. After curing of the SOG layer, a chemical-mechanical polishing (CMP) process is applied to the frontside surface. The CMP process increases the planarity of the frontside surface by reducing surface heights of elevated features more so than surface heights in recessed areas. After the silicon wafer is cleaned to remove CMP residue, an isotropic oxide layer may be deposited over the frontside surface to encapsulate the SOG layer.

17 Claims, 5 Drawing Sheets

METHOD FOR FORMING A HIGHLY PLANARIZED INTERLEVEL DIELECTRIC STRUCTURE

This application is a continuation of application Ser. No. 08/558,645, filed Nov. 13, 1995, now abandoned.

BACKGROUND OF THE INVENTION

1. Field of the Invention

This invention relates to integrated circuit manufacture and more particularly to a method of forming an interlevel dielectric structure having a high degree of surface planarity.

2. Description of the Relevant Art

An integrated circuit consists of electronic devices electrically coupled by conductive trace elements, often called interconnects. Interconnects are patterned from conductive layers formed on or above the surface of a silicon substrate. One or more layers can be patterned to form one or more levels of interconnects spaced from each other by one or more interlevel dielectric structures. Dielectric-spaced interconnect levels allow formation of densely patterned devices on relatively small substrate area.

An increase in the number of interconnect levels causes a corresponding increase in the elevational disparity of the resulting topological surface (i.e., an increase in the difference between the peaks and valleys of the resulting upper surface). Elevational disparity causes step coverage problems of interconnects placed over an interlevel dielectric peak and valley area. Elevational disparity also causes depth of focus problems of patterned interconnects formed on the interlevel dielectric. To reproduce fine line geometries, modern day optical steppers require small optical deviation of the interlevel dielectric surface to which the patterned interconnects are formed. In order to obtain maximum resolutions, imaging surfaces must be planar within ±0.5 microns. Sophisticated planarization techniques are therefore necessary to planarize the imaged surface. Planarization techniques are generally well known and exist in modern day fabrication processes.

Chemical vapor deposition (CVD) techniques typically yield conformal layers (i.e., layers which have the same thickness over horizontal and vertical surfaces). CVD is often used to deposit a dielectric layer over a substrate and/or over an interconnect level. When the thickness of the dielectric layer becomes appreciable relative to the distance between closely-spaced interconnects, undesirable air pockets (i.e., voids) may form between the closely-spaced interconnects. Either the CVD layer thickness must be minimized, or the interconnect spacing increased. Unfortunately, the former is more plausible than the latter due to the desire to increase the packing density and minimize the required surface area. If, however, the CVD layer thickness is decreased, other dielectric layers may be needed to complete an overall interlevel dielectric structure (i.e., a dielectric structure formed between interconnect levels).

Anisotropic CVD techniques present numerous advantages over conventional, isotropic CVD techniques employing standard LPCVD, PECVD and APCVD chambers. Anisotropic CVD has the ability to deposit material on horizontal surfaces at a faster rate than on vertical surfaces. Consequently, narrow spaces between closely-spaced interconnects can be filled with a dielectric material without creating substantial voids. Anisotropic CVD thereby produces a dielectric layer which is relatively thick on horizontal surfaces and relatively thin on vertical surfaces. Anisotropic CVD is particularly useful in forming a layer of dielectric upon a densely patterned underlayer of interconnects.

Another advanced CVD technique involves electron-cyclotron-resonance (ECR) CVD deposition. ECR is a relatively new plasma CVD technique in which deposition occurs simultaneously with sputter etching of the evolving layer. The high directionality of ECR plasma particles and simultaneous sputter etching produce a locally planar interlevel dielectric layer.

In addition to the CVD techniques, an interlevel dielectric layer can also be formed using a spin-on glass (SOG) material. Not only does SOG avoid creation of voids, but more importantly fills recesses or valleys as it flows across the upper surface prior to curing. Common SOG materials are siloxanes or silicates mixed in alcohol-based solvents. Applied to a wafer surface in liquid form, SOG materials typically flow over and fill narrow spaces between interconnects. Consequently, SOG materials produce a surface smoothing effect at isolated vertical edges. SOG materials are typically cured by baking to produce a hardened layer.

While anisotropic CVD, ECR plasma CVD, and SOG help planarize an upper surface during deposition, other techniques can be used to selectively remove surface material to planarize the surface after deposition. Namely, etch back steps can be employed either globally or locally to remove hills consistent with lower elevation valleys. More recent removal techniques utilize chemical-mechanical polishing (CMP). CMP applies both mechanical and chemical abrasion to an upper surface of a silicon wafer. During a CMP operation, a polishing pad saturated with an abrasive slurry solution is pressed against an upper surface of a silicon wafer. Movement of the pad relative to the wafer surface preferentially polishes elevated features on the upper surface. CMP thus increases surface planarity by reducing the heights of elevated features more so than the heights of structures in recessed areas. CMP can therefore be used to remove a dielectric surface at locally different rates which depend on the underlying pattern density. CMP is proven superior at quickly removing isolated or sparsely spaced upper elevational areas, while more slowly removing densely spaced upper elevational areas.

All of the above techniques have characteristics which limit their usefulness as a planarization method. Anisotropic CVD does not by itself increase the planarization of a surface since the upper elevational areas (hills) are increased similar to the lower elevational areas (valleys). ECR is able to increase the planarization of a surface, but throughput is limited as a result of simultaneous sputtering and further since few wafers can be processed simultaneously. SOG materials do not adhere well to metal interconnect lines, causing long-term reliability problems. SOG materials also tend to absorb water vapor which increases the resistance of electrical contacts formed in vias (i.e., holes etched through interlevel dielectric layers in order to electrically couple interconnect lines on different levels). A CMP process may have to be stopped before a high degree of planarity is reached in order to prevent the removal of too much surface material in certain critical areas. Further, CMP is useful to planarize isolated or sparsely spaced upper elevational areas. However, CMP leaves densely spaced upper elevational areas relatively intact. Despite their limitations, several of the above techniques may be advantageously combined into a highly effective interlevel dielectric planarization method, provided they are combined in a unique and advantageous fashion set forth hereinbelow.

SUMMARY OF THE INVENTION

The problems outlined above are in large part solved by a method of forming a highly planarized interlevel dielectric structure over a level of interconnects formed upon an upper topography of a silicon wafer. The dielectric structure comprises several layers formed in a unique fashion upon one another. According to one embodiment, an anisotropic CVD layer having a highly conformal component is formed upon the underlying silicon substrate or interconnect layer. The anisotropic CVD would advantageously form in narrow spaces without creating voids. An SOG material is then deposited over the exposed surface of the anisotropic CVD to increase the planarity of the upper surface. CMP is then used to further increase the planarity of the upper surface. resulting in relatively global planarization of the interlevel dielectric structure surface. According to another embodiment, the anisotropic CVD layer is formed using an ECR plasma CVD technique, thereafter followed by the SOG deposition and CMP.

The anisotropic CVD layer is preferably silicon dioxide (oxide). Unlike conventional CVD oxide, anisotropic deposited oxide material fills narrow spaces (e.g., less than 1.0 microns) without creating voids. The anisotropic oxide layer may be formed using a PECVD apparatus with the introduction of oxygen ($O_2$) and tetraethyl orthosilicate (TEOS) gases into the plasma enhanced chamber, along with helium (He) or ammonia ($NH_3$). Alternatively, the CVD layer is formed using ECR plasma CVD techniques. A spin-on glass (SOG) layer is then formed over the anisotropic oxide layer, hereinafter referred to as either anisotropic deposited oxide or ECR deposited-sputtered oxide. Applied in liquid form, the SOG material flows over the anisotropic oxide upper topography, filling narrow spaces without creating voids and producing a surface smoothing effect at isolated vertical edges.

After the SOG layer is cured by baking, a chemical-mechanical polishing (CMP) process is applied to the frontside surface. The CMP process further increases the planarity of the frontside surface by reducing the heights of elevated features more so than the heights of structures in recessed areas. Advantageously, the present two step sequence of anisotropic CVD followed by SOG produces fewer instances of isolated, elevationally-raised regions as compared to other elevationally-raised regions.

The CMP process is designed to remove most of the upper portions of the SOG layer and some of the upper portions of the anisotropic dielectric layer. The SOG layer is substantially resistant to the CMP polish process compared to the anisotropic dielectric layer. As such, the anisotropic dielectric (oxide) is removed at a faster rate than the SOG (silicate). A slower SOG etch rate is beneficial in that it helps ensure that little if any of the SOG-associated recess areas are removed as compared to higher elevational oxide-associated areas. Locally raised areas are therefore removed faster than recessed areas between, for example, widely spaced interconnects. As such, the present processing sequence achieves a substantial degree of global planarization—i.e., planarization across the entire substrate surface.

Following the CMP process, the silicon wafer is thoroughly cleaned to remove CMP residue. An isotropic dielectric layer is preferably formed over the frontside surface of the silicon wafer in order to encapsulate the remaining portions of the SOG layer. This step, typically performed prior to the formation of a subsequently placed interconnect level, prevents metal-SOG adhesion problems and any problems associated with SOG water sorption. Any vias required to electrically connect interconnects on different interconnect levels are etched following deposition of the isotropic dielectric layer.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
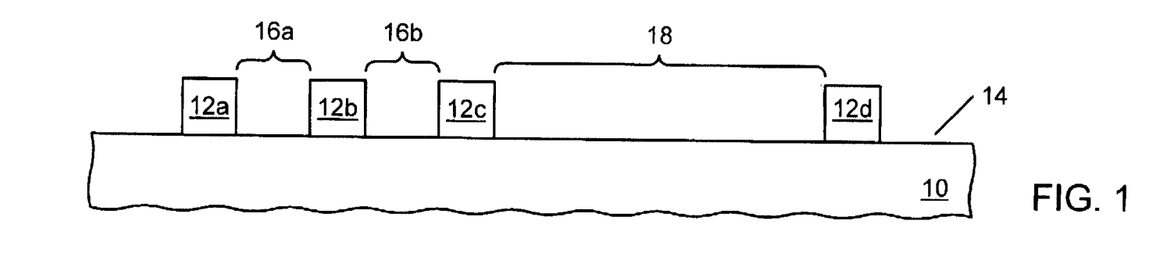
FIG. 1 is a partial cross-sectional view of a wafer substrate upper topography having interconnects formed thereon.

FIGS. 1–5 will be used to describe a first embodiment of an interlevel dielectric planarization method which includes a CMP process performed upon an interlevel dielectric structure consisting of an SOG layer formed over an anisotropic dielectric layer. FIG. 1 is a partial cross-sectional view of an upper topography 10 of a silicon wafer with interconnects 12a–d formed on a frontside surface 14 of upper topography 10. Interconnects 12a–d are typically created by first forming a layer of an electrically conductive material (e.g., aluminum, doped polysilicon, etc.) on frontside surface 14 of upper topography 10, then etching away portions of the layer of electrically conductive material to form a pattern or network of interconnects, generally referred to as an interconnect level. In a typical application, upper topography 10 includes a number of alternating interlevel dielectrics and interconnect levels formed upon an upper surface of a silicon wafer. The interconnect level from which interconnects 12a–d are formed can be one of many layers, or can be the only layer. It is therefore possible that interconnect level, including interconnects 12a–d, is the first, final, and only interconnect layer. In this case, upper topography 10 may be the upper surface of the silicon wafer.

As depicted in FIG. 1, interconnects 12a–c are relatively closely spaced, while interconnect 12d is relatively widely spaced from closest interconnect 12c. Closely-spaced regions 16a and 16b are formed between closely-spaced interconnects 12a and 12b, and between closely-spaced interconnects 12b and 12c, respectively. Widely-spaced region 18 is formed between widely-spaced interconnects 12c and 12d.

As defined herein, closely-spaced interconnects are laterally spaced a distance less than or equal to twice a minimum interconnect line spacing distance. Widely-spaced interconnects are laterally spaced a distance greater than or equal to six times a minimum interconnect line spacing distance. With current integrated circuit fabrication technology, exemplary interconnect line widths are about 1.0 microns, line thicknesses are about 0.5 microns, and minimum interconnect line spacing distances are approximately 0.5 microns.

Figure 2:
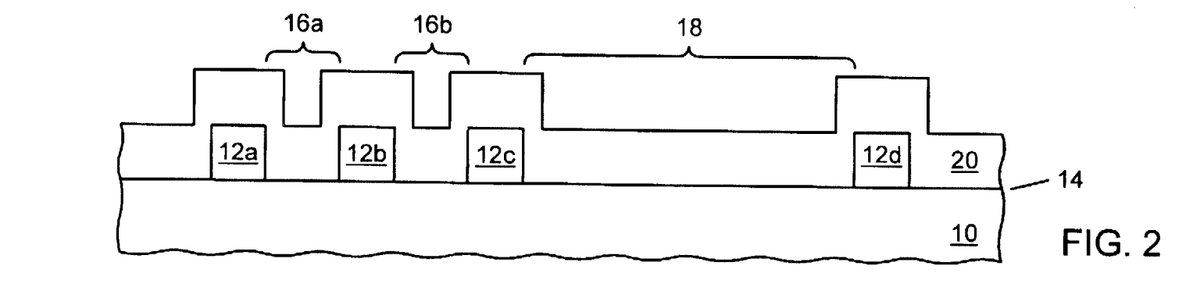
FIG. 2 is a partial cross-sectional view of the upper topography of FIG. 1 having an anisotropic silicon dioxide (oxide) layer deposited according to one embodiment.

FIG. 2 is a partial cross-sectional view of upper topography 10 of FIG. 1 with an anisotropic silicon dioxide (oxide) layer 20 deposited over frontside surface 14. Anisotropic oxide layer 20, thicker over horizontal surfaces than vertical surfaces, covers interconnects 12a–d and portions of frontside surface 14 in regions between interconnects 12a–d, including closely-spaced regions 16a–b and widely-spaced region 18.

The anisotropically enhanced deposition process is performed in a plasma-enhanced CVD (PECVD) chamber. Inside the chamber resides a target material placed between a pair of electrodes. Application of radio frequency (RF) power to the electrodes causes a glow discharge (i.e., a plasma) to be formed between the electrodes. Reactant gases contained within the reaction chamber produce chemically reactive species (atoms, ions, and radicals). These reactive species diffuse to the surface of the target material, and are adsorbed on the surface. Chemical reactions occur on the surface of the target material as a layer of a desired substance is formed. Volatile by-products are also formed, are desorbed from the surface of the target material, and diffuse into the ambient where they are thereafter expelled from the chamber.

One method of depositing an anisotropic oxide layer involves placing upper topography 10 in a reaction chamber containing TEOS, $O_2$, and He. The temperature inside the reaction chamber is increased to about 320° C., and the pressure inside the reaction chamber is reduced. At $O_2$:TEOS gas flow ratios of less than 1.0, anisotropic oxide deposition occurs. A second method of depositing an anisotropic oxide layer involves placing upper topography 10 in a reaction chamber containing TEOS, $O_2$, and $NH_3$. The temperature inside the reaction chamber is increased to about 390° C., and the pressure inside the reaction chamber is reduced. At TEOS, $O_2$, and $NH_3$ gas flow rates of 500 sccm, 500 sccm, and 5.0 sccm, respectively, anisotropic oxide deposition occurs. Both of the above anisotropic PECVD processes deposit oxide material on horizontal sections of frontside surface 14 of upper topography 10 at a rate greater than the rate at which oxide material is deposited on vertical surfaces (i.e., sides of interconnect lines). Without being bound by theory, it is postulated that the deposition process is strongly influenced by reactive species directed to the surface of the target material at angles approximately normal to frontside surface 14 of upper topography 10, resulting in anisotropic oxide depositions.

Anisotropic oxide layer 20 is preferably deposited to a thickness in horizontal areas approximately equal to the thicknesses of interconnects 12a–d. This allows the PECVD process to advantageously fill closely-spaced region 16a, between closely-spaced interconnects 12a and 12b, and closely-spaced region 16b, between closely-spaced interconnects 12b and 12c, without the creation of voids.

Figure 3:
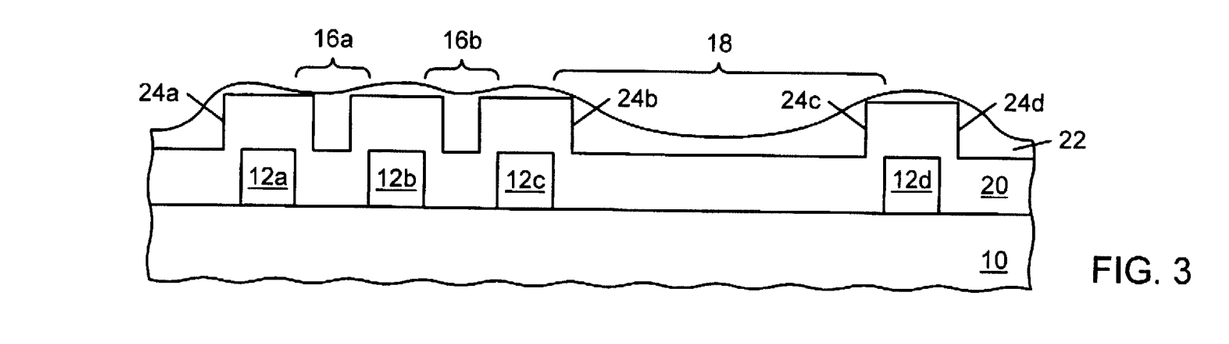
FIG. 3 is a partial cross-sectional view of the upper topography having an SOG layer deposited in a step subsequent to that shown in FIG. 2.

FIG. 3 is a partial cross-sectional view of upper topography 10 with an SOG layer 22 formed over anisotropic oxide layer 20 on frontside surface 14. SOG layer 22 may be formed using well-known methods typically involving several steps. A liquid SOG material is first applied to a frontside surface of an upper topography of a silicon wafer. The SOG layer is then cured by heating the silicon wafer in a furnace. A typical SOG curing process includes two heating steps. A first heating step is carried out at a relatively low temperature (e.g., 150–2500° C. for 1–15 minutes in air) to drive the solvent out of the SOG layer. A second heating step is then performed at a higher temperature (e.g., 400–425° C. for 30–60 minutes in air) to drive out water formed during polymerization of the SOG material. The remaining solid SOG film exhibits dielectric properties similar to those of an oxide film. If sufficient coverage is not obtained with a single coating of an SOG material, the SOG layer formation and curing steps may be repeated.

Common SOG materials include silicates or siloxanes mixed in alcohol-based solvents. Siloxane-based SOG materials have organic methyl ($CH_3$) or phenyl ($C_6H_5$) groups added to improve cracking resistance, and perform well in this application. Suitable siloxane-based SOG materials are available as tradename Accuglass® X-11 series obtainable from Allied-Signal, Milpitas, Calif. Using SOG materials in the Accuglass® X-11 series, uniform SOG layers with thicknesses between 1,000 angstroms and 4,000 angstroms may be formed on a frontside surface of the wafer topography.

A preferred method of applying an SOG material to a frontside surface of an upper topography of a silicon wafer is a spin-coat process. In a spin-coat process, a silicon wafer is typically held on a vacuum chuck. A sufficient amount of a liquid material (e.g., an SOG material) is then deposited in the center of the wafer, and allowed to spread out into a puddle. When the puddle reaches a predetermined diameter, the wafer and vacuum chuck are sent into a rotating motion about an axis near the center of and normal to the planar frontside surface of the wafer. The wafer and vacuum chuck are rapidly accelerated to a predetermined rotational speed. Centrifugal forces spread the liquid material from the center of the wafer to the wafer edge. Excess liquid material is thrown off of the edge of the wafer. An even flow of a liquid material is thus achieved across the frontside surface of the silicon wafer.

When cured, SOG layer 22 substantially fills closely-spaced region 16a, between closely-spaced interconnects 12a and 12b, and closely-spaced region 16b between closely-spaced interconnects 12b and 12c. In addition, SOG layer 22 produces a surface smoothing effect at vertical edges 24a–d adjacent to interconnects 12a, 12c, and 12d as shown in FIG. 3.

Figure 4:
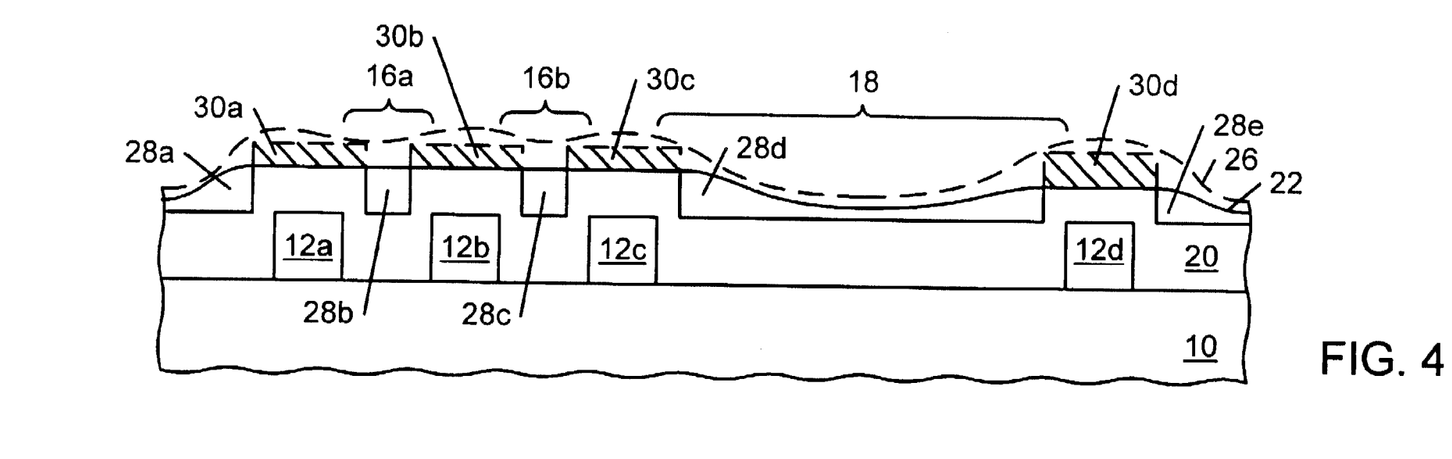
FIG. 4 is a partial cross-sectional view of the upper topography of FIG. 3 following application of a CMP process.

FIG. 4 is a partial cross-sectional view of upper topography 10 of FIG. 3 following application of a CMP process. During a CMP process, a silicon wafer is typically held on a vacuum chuck of a CMP tool. A polishing pad of the CMP tool, saturated with an abrasive slurry solution, is pressed against a frontside surface of the silicon wafer. The polishing pad and the vacuum chuck are then caused to rotate in opposite directions by an electrical motor. Movement of the polishing pad relative to the frontside surface of the silicon wafer preferentially polishes elevated features on the frontside surface.

One characteristic of SOG layers is that they are somewhat resistant to CMP polish processes. The fact that SOG layer 22 is more resistant to the CMP polish process than the CVD oxide helps ensure that little (if any) of the SOG layer 22 and underlying anisotropic oxide layer 20 is removed in low elevational portions of widely-spaced region 18. Without a SOG layer, appreciably more of anisotropic oxide layer 20 would be removed in low elevational portions of widely-spaced region 18 during the CMP process, with more of anisotropic oxide layer 20 being removed in the center of widely-spaced region 18 than at the edges. Thus the combination of a SOG layer and a CMP polish process is beneficial in establishing a more planar upper surface of the resulting interlevel dielectric structure hereof.

As polishing time increases, the amount of friction between the polishing pad and the frontside surface of the silicon wafer increases. This increase in friction causes an increase in the amount of current required by the electrical motor in order to maintain the constant rotational speeds of the polishing pad and wafer chuck. The CMP process may be terminated when the friction between the polishing pad and the frontside surface of the silicon wafer exceeds a threshold value as detected by a current sensor in the wires supplying electrical power to the electrical motor of the CMP tool.

In FIG. 4, dashed line 26 shows the outline of the upper surface of SOG layer 22 prior to application of the CMP process. The CMP process removes most of the upper portions of SOG layer 22. Following the CMP process, only SOG regions 28a–e of SOG layer 22 remain. Anisotropic oxide regions 30a–d of anisotropic oxide layer 20 are also removed during the CMP process. It is noted that anisotropic oxide region 30d is larger than anisotropic oxides regions 30a–c. This is due to the fact that a CMP process tends to remove more material from isolated features with relatively small upward directed areas.

Figure 5:
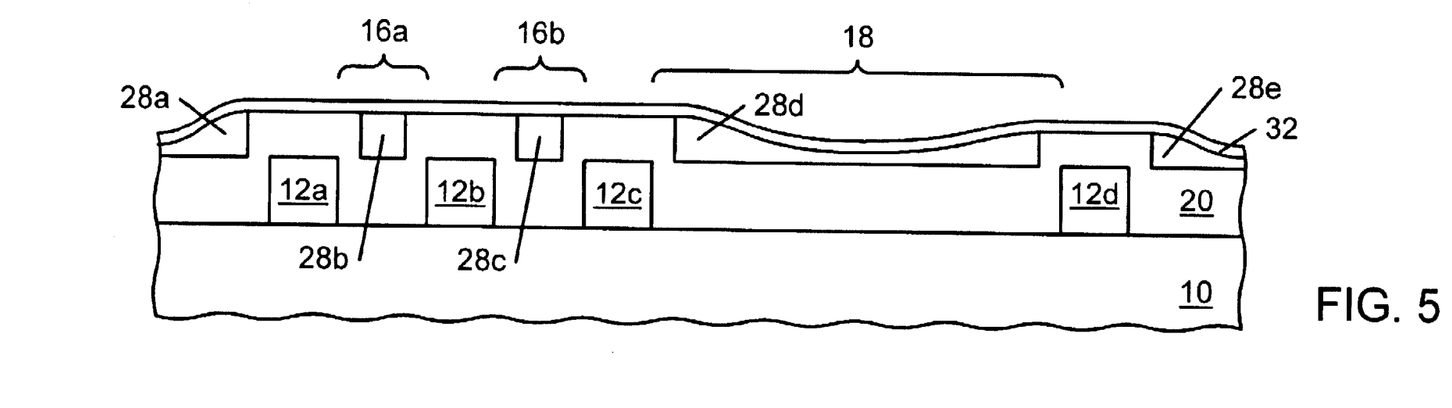
FIG. 5 is a partial cross-sectional view of the upper topography of FIG. 4 following deposition of an isotropic oxide layer.

FIG. 5 is a partial cross-sectional view of isotropic oxide layer 32 deposited in a step subsequent to CMP polish. Conformal isotropic oxide layer 32 encapsulates SOG regions 28a–e, ensuring metal interconnects formed over isotropic oxide layer 32 do not contact SOG material. This prevents metal-SOG adhesion problems and any problems associated with SOG water sorption. Isotropic oxide layer 32 is preferably deposited to a thickness of between 0.5 micron to 1.0 micron using common CVD deposition procedures. Isotropic oxide layer 32 may be formed in a CVD chamber containing silane ($SiH_4$) and oxygen ($O_2$) at temperatures of less than about 500° C. through the following reaction:

Following deposition of isotropic oxide layer 32, a substantially planar interconnect dielectric layer is formed.

Figure 6:
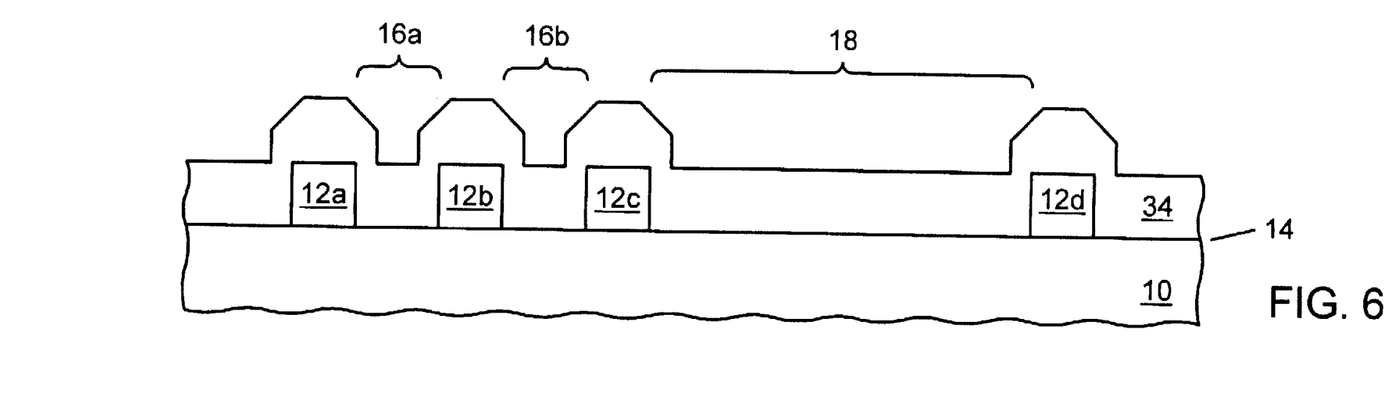
FIG. 6 is a partial cross-sectional view of the upper topography of FIG. 1 having an ECR anisotropic oxide layer deposited according to another embodiment hereof.

In a second embodiment of the present invention, an ECR plasma CVD technique is used to deposit an anisotropic oxide layer. FIG. 6 is a partial cross-sectional view of upper topography 10 with an ECR anisotropic oxide layer 34 deposited over frontside surface 14. ECR anisotropic oxide layer 34 covers interconnects 12a–d and portions of frontside surface 14 in regions between interconnects 12a–d, including closely-spaced regions 16a–b and widely-spaced region 18.

In an ECR plasma CVD technique, a target material is placed between a pair of electrodes in a reaction chamber. Argon (Ar) gas along with one or more reactant gases are introduced into a plasma chamber adjacent to the reaction chamber. When RF energy at microwave frequencies (e.g., 2.45 GHz) is introduced into the plasma chamber, a plasma is created, producing chemically reactive species (atoms, ions, and radicals). The reactive species, along with atoms of other reactant gases introduced into the reaction chamber, are directed toward the target material by magnetic fields created by large coils surrounding the plasma chamber. Chemical reactions occur on the surface of the target material as a layer of a desired substance is formed. Volatile by-products are also formed, are desorbed from the surface of the target material, and diffuse into the ambient. Application of RF power between the electrodes causes the growing layer to be simultaneously sputter etched by Ar ions. See, S. Wolf, *Silicon Processing for the VLSI Era*, Vol. 2, pp. 237–8 (herein incorporated by reference).

ECR anisotropic oxide layer 34 may be deposited using a well-known ECR plasma CVD technique. The technique involves placing upper topography 10 in an ECR reaction chamber containing silane ($SiH_4$), oxygen ($O_2$), and argon (Ar), and reducing the pressure inside the reaction chamber. ECR anisotropic layer 34 is thus formed through the following reaction:

An ECR plasma CVD technique is able to deposit dielectric material on horizontal sections of frontside surface 14 of upper topography 10 at a rate greater than the rate at which it deposits dielectric material on vertical surfaces (i.e., sides of interconnect lines). This ability may be advantageously employed to fill closely-spaced region 16a, between closely-spaced interconnects 12a and 12b, and closely-spaced region 16b, between closely-spaced interconnects 12b and 12c, with oxide material without the creation of voids. The argon ions sputter etch the oxide layer as it grows, producing characteristic facets on the upper surface of ECR anisotropic oxide layer 34 over interconnects 12a–d as shown in FIG. 6.

Figure 7:
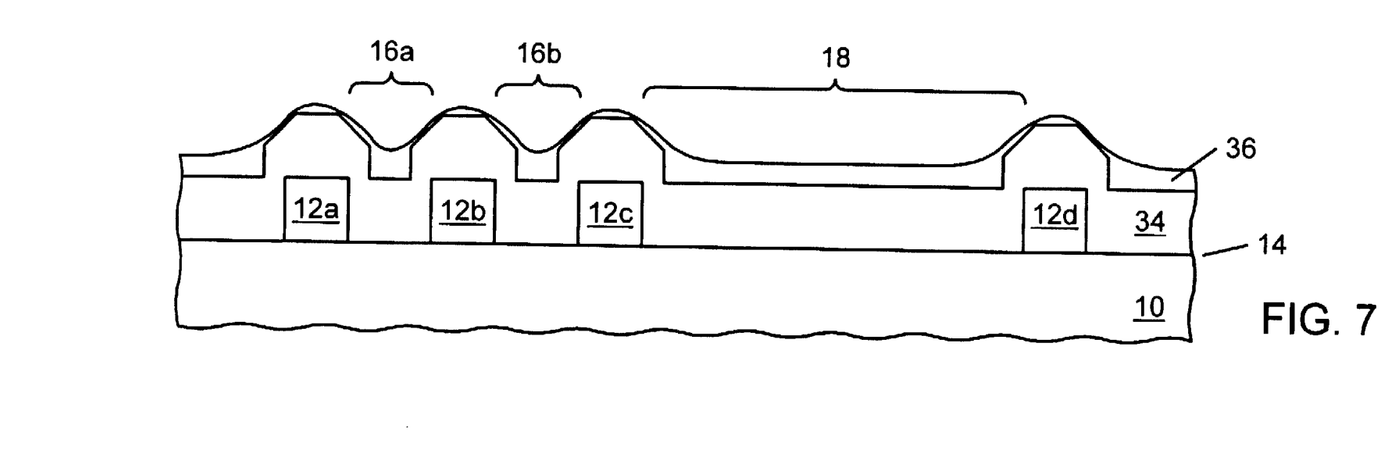
FIG. 7 is a partial cross-sectional view of the upper topography of FIG. 6 having an SOG layer formed over the ECR anisotropic oxide layer.

FIG. 7 is a partial cross-sectional view of upper topography 10 of FIG. 6 with an SOG layer 36 formed over ECR anisotropic oxide layer 34 on frontside surface 14. As described above, SOG layer 36 may be formed over frontside surface 14 according to well-known methods.

Figure 8:
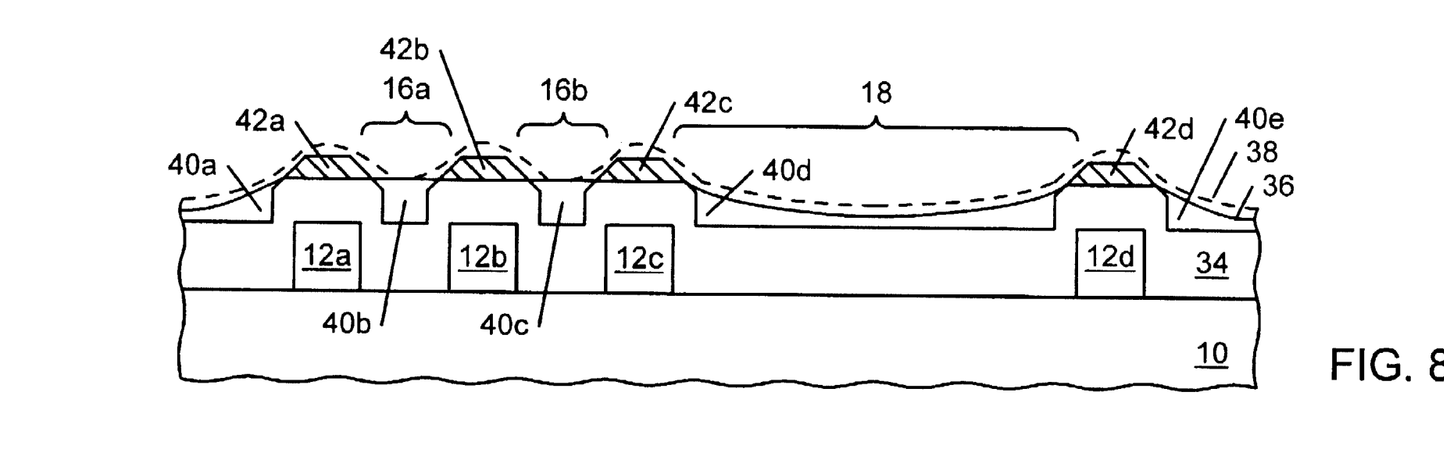
FIG. 8 is a partial cross-sectional view of the upper topography of FIG. 7 following application of a CMP process.

FIG. 8 is a partial cross-sectional view of the upper topography 10 of FIG. 7 following application of the CMP process as described above. Dashed line 38 shows the outline of the upper surface of SOG layer 36 prior to application of the CMP process. The CMP process removes most of the upper portions of SOG layer 36. Following the CMP process, only SOG regions 40a–e of SOG layer 36 remain. ECR anisotropic oxide regions 42a–d of ECR anisotropic oxide layer 34 are also removed during the CMP process. It is noted that ECR anisotropic oxide region 42d is larger than anisotropic oxides regions 42a–c. This is due to the fact that a CMP process tends to remove more material from isolated features with small upward exposed areas. ECR plasma CVD followed by SOG presents a small-area isolated region, smaller than anisotropic CVD followed by SOG. The ECR process ensures that the upward exposed area is sputter removed at the edges, thereby resulting in a smaller raised horizontal surface. As shown, CMP removes the smaller raised surface at a faster rate than if the surface were large.

Figure 9:
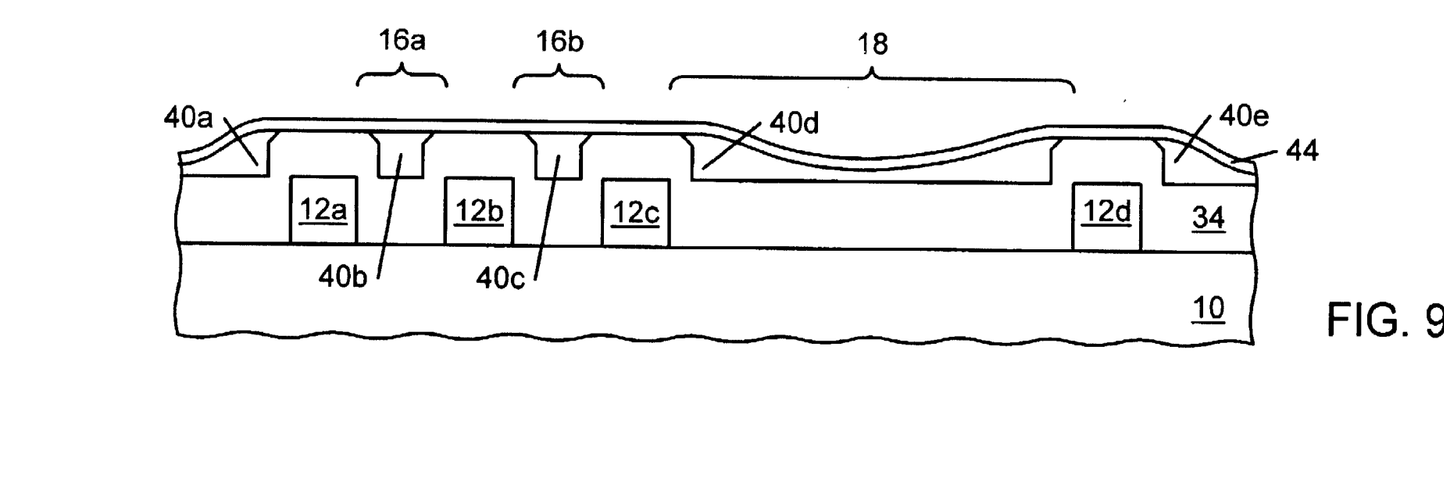
FIG. 9 is a partial cross-sectional view of the upper topography of FIG. 8 following deposition of an isotropic oxide layer.

FIG. 9 is a partial cross-sectional view of upper topography 10 of FIG. 8 following deposition of an isotropic oxide layer 44. Conformal isotropic oxide layer 44 encapsulates SOG regions 40a–e, ensuring metal interconnects formed over isotropic oxide layer 44 do not contact SOG material. Following deposition of isotropic oxide layer 44, a substantially planar interconnect dielectric layer is formed.

Figure 10:
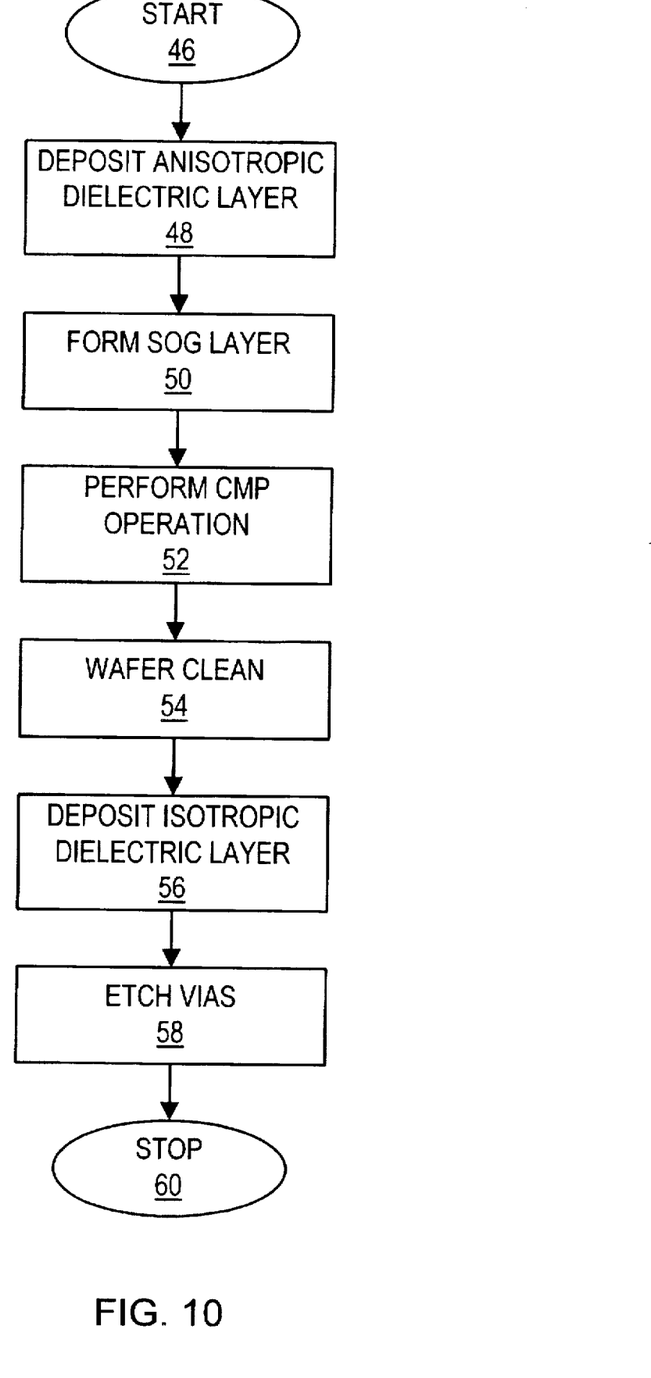
FIG. 10 is a flow chart of an interlevel dielectric planarization method which includes a CMP process performed upon an interlevel dielectric structure comprising an SOG layer formed over an anisotropic dielectric layer.

FIG. 10 is a flow chart of an interlevel dielectric planarization method which includes a CMP process performed upon an interlevel dielectric structure consisting of an SOG layer formed over an anisotropic dielectric layer. Following a start step 46, a step 48 includes the deposition of an anisotropic dielectric layer upon a frontside surface of a silicon wafer. The anisotropic dielectric layer may be an oxide layer formed using a PECVD process with TEOS and $O_2$ included as the reactant gases, along with He or $NH_3$. The anisotropic dielectric layer may also be an oxide layer formed using a ECR plasma CVD process utilizing simultaneous deposition and sputtering.

Step 50 includes the formation of an SOG layer over the anisotropic dielectric layer. Applied in liquid form, SOG materials typically flow over and fill narrow spaces between interconnects without creating voids. Step 52 involves the application of a CMP process as described above. The CMP process increases surface planarity by reducing the heights of elevated features more so than the heights of structures in recessed areas. The CMP process removes most (if not all) of the elevationally raised portions of the SOG layer and some of the elevationally raised portions of the anisotropic dielectric layer. The fact that the SOG layer is relatively resistant to the CMP polish process is beneficial in that it helps ensure that little (if any) of the SOG and underlying anisotropic dielectric layer is removed in low elevational portions of widely-spaced regions between interconnects.

Following the CMP process, the silicon wafer is thoroughly cleaned to remove CMP residue during a step 54. A suitable wafer cleaning procedure uses a technique well known as the RCA method followed by rinsing with deionized water. Although there have been many adaptations, an RCA cleaning process involves the use of hydrogen peroxide as an oxidant along with an acid or base to remove organic film and inorganic ion and heavy metal contaminants. Following the water rinse, the silicon wafer may be subjected to a heating step in order to drive out any water absorbed by the remaining portions of the SOG layer during the cleaning process.

During a step 56, an isotropic dielectric layer is formed over the frontside surface of the silicon wafer in order to encapsulate the remaining portions of the SOG layer. This step is typically performed prior to the formation of another interconnect layer on the upper surface of the isotropic dielectric layer. Any vias required to electrically connect interconnects on different interconnect levels are etched during a step 58. A stop step 60 completes the interlevel dielectric layer planarization process.

It will be appreciated by those skilled in the art having the benefit of this disclosure that this invention is believed to be capable of forming dielectric structures between each of a plurality of interconnect levels. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method of forming a multi-layer interlevel dielectric structure, comprising the steps of:

providing a silicon wafer having a plurality of spaced interconnects formed thereon;

while undergoing sputter etching, depositing an anisotropic oxide layer upon and between said interconnects;

spin-on depositing a glass layer upon the anisotropic oxide layer; and chemical-mechanical removing portions of the oxide layer and the glass layer, wherein elevationally raised portions of the glass and oxide layers are removed at a faster rate than elevationally recessed portions of the glass and oxide layers.

2. The method as recited in claim 1, wherein elevationally raised portions of the oxide layer are removed at a faster rate than elevationally raised portions of the glass layer during the chemical-mechanical removing step.

3. A method of forming a multi-layer interlevel dielectric structure, comprising the steps of:

providing a silicon wafer having a plurality of spaced interconnects formed thereon;

while undergoing sputter etching, depositing an anisotropic oxide layer upon and between said interconnects to form elevationally raised and elevationally recessed portions of the oxide layer;

spin-on depositing a glass layer upon the anisotropic oxide layer to form elevationally raised and elevationally recessed portions of the glass layer; and chemical-mechanical removing portions of the oxide layer and the glass layer, wherein elevationally raised portions of the oxide layer are removed at a faster rate than elevationally raised portions of the glass layer, and further wherein elevationally raised portions of the glass and oxide layers are removed at a faster rate than elevationally recessed portions of the glass and oxide layers.

4. The method as recited in claim 3, wherein the plurality of interconnects are spaced at relatively wide and narrow distances from each other.

5. The method as recited in claim 3, wherein the anisotropic oxide layer is deposited using an electron-cyclotron-resonance (ECR) plasma CVD method.

6. The method as recited in claim 3, wherein the anisotropic oxide layer is deposited to a thickness approximately equal to the thicknesses of the interconnects.

7. The method as recited in claim 3, wherein the step of spin-on depositing the glass layer, comprises:

spin depositing a silicate-based material in liquid form upon the oxide layer to a greater extent in elevationally recessed portions of the oxide layer relative to elevationally raised portions of the oxide layer;

baking said silicate-based material to remove solvents; and baking said silicate-based material in a step subsequent to the aforementioned baking step to form a hardened said glass layer.

8. The method as recited in claim 7, wherein the silicate-based material comprises siloxanes.

9. The method as recited in claim 3, further comprising a step of cleaning exposed portions of oxide and glass layers after said chemical-mechanical removing step.

10. The method as recited in claim 9, wherein the step of cleaning the silicon wafer comprises rinsing the silicon wafer with deionized water.

11. The method as recited in claim 9, further comprising a step of depositing an isotropic oxide layer upon said frontside surface after the step of cleaning the silicon wafer.

12. The method as recited in claim 11, wherein the isotropic oxide layer is deposited using a CVD method.

13. A method of forming a substantial planar upper surface of an interlevel dielectric structure, comprising the steps of:

provding a silicon wafer with a plurality of interconnects spaced at relatively wide and narrow distances from each other;

while undergoing sputter etching, depositing an anisotropic oxide layer of first and second thicknesses on and between said plurality of interconnects, wherein the first thickness is greater than said second thickness and resides on horizontal surfaces directly above said plurality of interconnects while the second thickness resides on vertical surfaces abutting a sidewall of each said plurality of interconnects, and wherein the first thickness upon said plurality of interconnects forms a plurality of elevationally raised oxide surfaces;

spin-on depositing a glass layer upon the anisotropic oxide layer to form a plurality of elevationally raised glass surfaces in areas directly above said plurality of elevationally raised oxide surfaces;

chemical-mechanical removing the elevationally raised glass surfaces at a higher rate than glass surfaces between the elevationally raised glass surfaces and at a lower rate than the oxide surfaces of the elevationally raised oxide surfaces;

cleaning residue from the chemical-mechanical removed surface; and depositing an isotropic oxide layer of substantially uniform thickness across the cleaned chemical-mechanical removed surface.

14. The method as recited in claim 13, wherein said providing step comprises depositing a conductive layer upon the silicon wafer and thereafter selectively removing the conductive layer to present said plurality of interconnects.

15. The method as recited in claim 13, wherein said depositing step comprises placing said silicon wafer into a chemical vapor deposition chamber and thereafter depositing said oxide simultaneous with sputter removing portions of said oxide abutting upper, lateral surfaces of said plurality of interconnects.

16. The method as recited in claim 15, wherein said chemical vapor deposition chamber comprises a cyclotron-resonance plasma deposition chamber.

17. The method as recited in claim 13, wherein the elevationally raised glass surface or the elevationally raised oxide surface is less than the thickness of said interconnect above the glass surfaces between the elevationally raised glass surface.

* * * * *